(12) United States Patent
Krick

(10) Patent No.: US 10,101,014 B2
(45) Date of Patent: Oct. 16, 2018

(54) LIGHTING MODULE FOR A MOTOR VEHICLE, INCLUDING A MODULATED INTENSITY SOURCE OF COHERENT LIGHT

(71) Applicant: VALEO VISION, Bobigny (FR)

(72) Inventor: Sebastian Krick, Paris (FR)

(73) Assignee: VALEO VISION, Bobigny (FR)

( * ) Notice: Subject to any disclaimer, the term of this patent is extended or adjusted under 35 U.S.C. 154(b) by 0 days.

(21) Appl. No.: 15/403,360

(22) Filed: Jan. 11, 2017

(65) Prior Publication Data

US 2017/0198897 A1 Jul. 13, 2017

(30) Foreign Application Priority Data

Jan. 11, 2016 (FR) ...................... 16 50202

(51) Int. Cl.
*B60Q 1/00* (2006.01)
*F21V 25/00* (2006.01)
*F21S 8/10* (2006.01)
*H01S 5/062* (2006.01)
*F21S 41/40* (2018.01)
*F21S 41/14* (2018.01)

(52) U.S. Cl.
CPC ............ *F21V 25/00* (2013.01); *B60Q 1/0076* (2013.01); *F21S 41/14* (2018.01); *F21S 41/40* (2018.01); *F21S 48/1145* (2013.01); *F21S 48/14* (2013.01); *H01S 5/062* (2013.01)

(58) Field of Classification Search
CPC ....... F21S 48/1145; F21S 48/14; F21V 25/00; B60C 1/0076; H01S 5/062
USPC .................................................. 315/82, 291
See application file for complete search history.

(56) References Cited

U.S. PATENT DOCUMENTS

| 2011/0063115 A1* | 3/2011 | Kishimoto ................ F21K 9/00 340/600 |
| 2013/0075692 A1* | 3/2013 | Naasani ................. C09K 11/02 257/13 |
| 2014/0003074 A1* | 1/2014 | Kishimoto ......... C09K 11/0883 362/510 |
| 2014/0009952 A1 | 1/2014 | Nomura et al. |
| 2015/0252974 A1* | 9/2015 | Hu ...................... F21S 48/1225 362/510 |
| 2016/0033112 A1* | 2/2016 | Weissenberger .... F21S 48/1225 362/510 |
| 2016/0096467 A1* | 4/2016 | Murakami .......... F21S 48/1757 315/82 |
| 2016/0245471 A1* | 8/2016 | Nakazato ............. F21S 48/1195 |

(Continued)

FOREIGN PATENT DOCUMENTS

JP 2013-168585 A 8/2013

OTHER PUBLICATIONS

French Preliminary Search Report dated Aug. 30, 2016 in French Patent Application No. 1650202 (with English translation of categories of cited documents).

*Primary Examiner* — Don Le
(74) *Attorney, Agent, or Firm* — Oblon, McClelland, Maier & Neustadt, L.L.P.

(57) ABSTRACT

The invention proposes a lighting module for a motor vehicle, including a modulated intensity source of coherent light. The features of the invention make it possible to increase the safety of a device of this kind by employing more robust fault detection than the prior art. A method for controlling a device of this kind is also proposed.

19 Claims, 2 Drawing Sheets

(56) References Cited

U.S. PATENT DOCUMENTS

2017/0104972 A1* 4/2017 Novotny .................. H04N 9/77
2017/0105265 A1* 4/2017 Sadwick .............. A61N 5/0618

* cited by examiner

LIGHTING MODULE FOR A MOTOR VEHICLE, INCLUDING A MODULATED INTENSITY SOURCE OF COHERENT LIGHT

The invention relates to the field of lighting devices, notably for motor vehicles. The invention relates to a lighting device including a source of coherent light.

A motor vehicle is equipped with headlights, also termed headlamps, intended to illuminate the road in front of the vehicle at night or in situations of reduced brightness. It is known to use light sources adapted to emit coherent light in headlights for motor vehicles. This refers to semiconductor elements such as laser diodes, for example. As is known, light sources using semiconductor elements are supplied with electrical power in devices of this kind by way of a DC/DC converter. A converter of this kind is adapted to convert a first current, supplied by a battery of the motor vehicle for example, into a second current different from the first and to supply the semiconductor elements with electrical power.

Lighting systems using laser diodes generally function in accordance with a principle of diffusing coherent light to render it incoherent. The incoherent light produced in this way is then emitted by the lighting system. The conversion of coherent light into incoherent light is important for safety reasons, since coherent light can have harmful effects on the human eye. It is known to produce a lighting device for a motor vehicle including a laser diode that illuminates a phosphor element with monochromatic laser light, for example blue laser light. The phosphor element converts the incident coherent light into incoherent light. Lighting devices of this kind generally include safety systems including optical filters and sensors adapted to sense monochromatic light coming directly from the light source and incoherent light converted by the diffuser. In fact, an optical filter having a pass-band that includes the color of the monochromatic coherent source may be used for this. However, prior art devices of this kind are not robust with respect to external ambient light which may be incident on the filter and/or sensor but is not generated by the coherent source and the diffuser. This defect can lead the safety system to generate false positives or false negatives.

An objective of the invention is to alleviate at least one of the problems posed by the prior art. To be more precise, one objective of the invention is to propose a device and a method that offer enhanced safety relative to the prior art devices, notably in relation to the detection of faults generating a probable escape of coherent light.

The invention consists in a lighting module for a motor vehicle. The lighting module includes a light source adapted to emit coherent light, modulation means intended to modulate the intensity of the light emitted by said source in accordance with a modulation signal, and conversion means such that at least a portion of the incident coherent light coming from said source is converted into incoherent light. The lighting module is remarkable in that it further includes production means of a variation signal indicating the variation of the luminous intensity of incident light disposed downstream of the conversion means and control means of the light source configured to compare the variation signal to the modulation signal and to control the operation of said light source following the comparison of said variation signal to said modulation signal.

The modulation signal may preferably be sinusoidal or alternate between at least two continuous values.

The conversion means may preferably be aligned with a direction of emission of light rays from the light source. The production means may preferably be aligned with said emission direction downstream of said source.

The term "downstream" is to be understood as referring to the direction of the direct or indirect path of light rays emitted by the light source. Consequently, optical deflection means may be disposed between the conversion means and the production means and adapted to deflect the converted light from the conversion means to the production means, the production means therefore remaining downstream of the conversion means.

The control means may preferably be adapted to extinguish the light source if the variation signal is substantially identical to the modulation signal.

The modulation means may preferably include regulating means of the electrical current supplying electrical power to the light source.

The regulating means of the electrical current may preferably be adapted to supply an electrical current with different average values.

The regulating means of the electric current may preferably include a "step down" or Buck converter.

The Buck converter may preferably be adapted to supply an electrical current with different average values according to the chopping frequency chosen and with unchanged input and output voltages.

The modulation means may preferably be configured to modulate the luminous intensity emitted by the light source by alternating the amplitude of the ripple current of the converter in accordance with a predetermined modulation signal.

The modulation means may preferably be adapted to modulate the luminous intensity by alternating the amplitude of the peak current of the converter according to a predetermined modulation signal.

The modulation means may preferably include a generator adapted to generate at least one modulation signal.

The modulation means may preferably include a modulation signal generator.

The conversion means may preferably include a photoluminescent material. This may be a phosphorescent material, for example.

The production means of the variation signal may preferably include an optical sensor sensitive to the wavelength of coherent light emitted by the light source. The optical sensor may include a photodiode, for example.

The optical sensor may preferably be sensitive to the wavelength of incoherent light diffused by the conversion means.

The production means of the variation signal may preferably include a microcontroller functionally connected to the optical sensor.

The control means may preferably include a comparator electronic circuit. The control means may preferably include a band-pass filter centered on the modulation frequency of the modulation signal.

The control means may preferably include a microcontroller.

The control means may preferably be configured to extinguish the light source if the compared characteristic or characteristics of the modulation signal and the variation signal are similar. The compared characteristics may preferably include the frequency or the amplitude of the signals.

The control means may preferably extinguish the light source if the compared characteristics differ from one another by less than 20%.

The light source may preferably be of the semiconductor laser type.

The lighting module may preferably include an optical element positioned so that at least a portion of the incoherent light diffused by the conversion means is deflected in at least one predetermined direction.

The optical element may include a reflector element.

The reflector element may preferably include an at least partly reflective surface adapted to reflect incoherent light diffused by the conversion means.

Alternatively, the production means may be disposed under the reflector element so as to be able to receive rays reflected by said reflector.

An optical sensor of the production means of the variation signal may preferably be accommodated in a reflective surface of the reflector element.

The invention also consists in a method of controlling at least one light source of a lighting module according to the invention. The light source is adapted to emit coherent light in an emission direction. The method is noteworthy in that it includes the following steps:

modulating the intensity of the light emitted by said source using a modulation signal, producing a variation signal indicating the variation of the luminous intensity of the light incident on the production means of a variation signal of the lighting module, comparing at least one characteristic of the variation signal and the modulation signal, and extinguishing said light source if the compared characteristic or characteristics are similar.

The compared characteristics may preferably include the frequency or the amplitude of the signals.

The extinguishing step may preferably take place if the compared characteristics differ from one another by less than 20%.

By using the features of the invention it becomes possible to propose a lighting module for a motor vehicle using a source emitting coherent light whilst reducing the risk of coherent light escaping from the device, which increases the safety of road users. In fact, by using the device according to the invention it becomes less probable that a human eye on which the light from the device is incident will be injured. By modulating the coherent light emitted it becomes possible to confer on it measurable properties that neither light diffused within the device nor external ambient light has. According to one preferred embodiment, the coherent light emitted is modulated by a converter of a power supply circuit of the light source in question. Alternating at least two distinct average currents alternates the chopping frequency of the converter in the same way, which results in a reduction of the electromagnetic waves emitted by the converter. Reducing the electromagnetic emissions at the level of the converter in turn makes possible the use in the lighting device of electromagnetic protection means of lower performance and lower cost. In fact, the electronic components of a device of this kind are sensitive to electromagnetic emissions.

Other features and advantages of the present invention will be better understood in the light of the description of examples and the drawings, in which.

In the following description, similar reference numbers will be used in describing similar concepts via different embodiments of the invention. Thus the numbers 100, 200 identify a lighting module in two different embodiments of the invention.

Unless specifically indicated otherwise, technical features described in detail for a given embodiment may be combined with the technical features described by way of nonlimiting example in the context of other embodiments.

Figure 1:
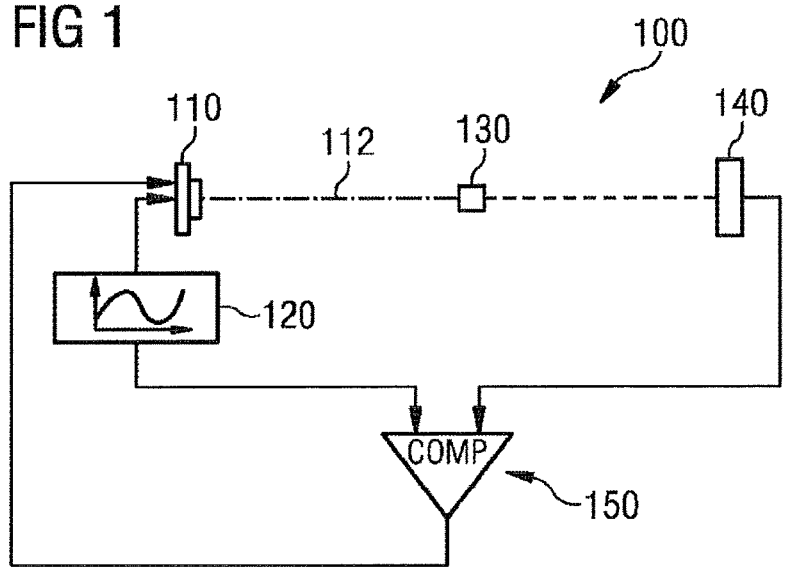
FIG. 1 is a diagrammatic illustration of a lighting module according to one preferred embodiment of the invention.

FIG. 1 shows a diagrammatic representation of a lighting module 100 according to one embodiment of the invention. A light source 110 is adapted to emit coherent light in a principal emission direction 112. It is a semiconductor source such as a laser diode, for example. The intensity of the light emitted by the source is modulated by modulation means 120. The modulation signal may be sinusoidal or alternate between at least two continuous values, for example. Control means 150 are functionally connected to the light source. The control means may for example include a circuit for controlling the electrical power supply of the light source. The module includes conversion means 130, for example a phosphorescent material or any other optical diffusion means which emit incoherent and visible light when coherent light is incident on them. The module 100 also includes production means 140 of a signal for varying the received luminous intensity. This refers for example to an optical sensor sensitive to luminous intensity in a frequency band corresponding to the wavelength emitted by the light source 110. The arrangement is such that the modulated coherent light emitted by the source 110 is incident on the conversion means 130. If the conversion element 130 is defective, the coherent light rays continue to propagate in the direction of the production means 140 of a variation signal. The production means 140 of a variation signal are therefore preferably aligned with an emission direction 112 downstream of the source 110 and the conversion means. In FIG. 1, the conversion means 130 and the production means 140 of a variation signal are shown on physical supports that place them on the axis defined by the emission direction 112. Other support means will be evident to the person skilled in the art without departing from the context of the present invention.

The signal produced by the production means 140 of a variation signal is compared to the modulation signal used to modulate the intensity of the light emitted by the light source 110. To this end, the control means 150 include a comparator circuit. If the signal produced is equivalent to the modulation signal, this indicates that the coherent light has not been diffused correctly by the conversion means 130. This situation corresponds to a fault. The comparator makes it possible to detect this fault and to cut off the supply of electrical power to the light source 110 as a consequence of this. If the signal produced is not equivalent to the modulation signal, the operation of the device is judged normal and the supply of electrical power to the light source 110 is maintained.

Figure 2:
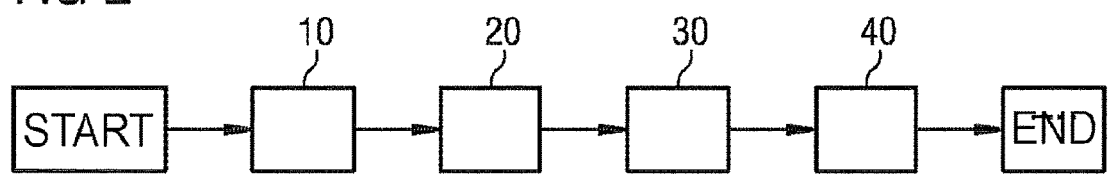
FIG. 2 is a diagram indicating the principal steps of a method according to one preferred embodiment of the invention.

FIG. 2 shows the principal steps of a method according to the invention in which in a first step 10 the intensity of the light emitted by the light source is modulated by means of a modulation signal. In a second step 20 the variation signal that has just been described is produced by the production means of a variation signal. Characteristics of the initial modulation signal and the variation signal produced in this way are compared in the step 30 and finally, in the step 40, control means extinguish the light source by cutting off the supply of electrical power if the compared characteristics are similar. The compared characteristics may by way of non-limiting example include a frequency of the signals or their amplitude. The extinguishing step preferably takes place if the compared characteristics differ from one another by less than 20%.

Figure 3:
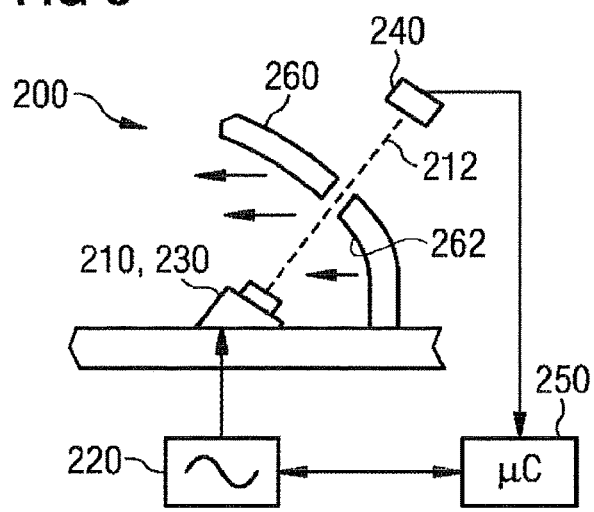
FIG. 3 is a diagrammatic illustration of a lighting module according to one preferred embodiment of the invention.

FIG. 3 shows a preferred embodiment of the lighting module 200 according to the invention. Operation is similar to the operation described with reference to the FIG. 1 embodiment.

A light source 210 is adapted to emit coherent light in a principal emission direction 212. The intensity of the light emitted by the source is modulated by modulation means 220. Control means 250, including a programmable microcontroller, for example, are functionally connected to the light source and to the modulation means 220. In the example shown, the conversion means 230 are integrated into the light source 220. This refers for example to a thin layer of phosphorescent material that coats the semiconductor laser chip emitting surface 230. Production means 240 of a variation signal are arranged on the axis defined by the emission direction. The signal produced by the production means 240 of a variation signal is compared to the modulation signal used to modulate the intensity of the light emitted by the light source 210. To this end, the microcontroller 250 is adapted to compare characteristics of the modulation signal and the variation signal. The lighting module 200 further includes a reflector element 260 having an internal surface 262 that at least partly reflects light diffused by the conversion means 230 incident on it. The geometry of the surface 262 is such that at least a portion of the incoherent light diffused by the conversion means is reflected in at least one predetermined direction. This is preferably a unique direction, indicated by way of example in FIG. 3 by arrows. The production means 240 of the variation signal are preferably generally accommodated flush with the reflective surface 262 of the reflector element 260. Alternatively, as indicated in FIG. 3, the surface 262 includes an opening placed so that the axis defined by the emission direction of the light source 210 passes through it. The production means 240 of the variation signal are then placed behind the reflective surface 262 of the reflector element 260, in line with the axis.

In all the embodiments the modulation means may preferably be produced with the aid of a step down or Buck converter forming part of the means controlling the supply of power to the light source 110, 210. Using a converter already present in a known architecture makes it possible to dispense with an electronic circuit dedicated only to the modulation of the luminous intensity emitted by the source in question and results in a saving of space and cost. Generally speaking, the luminous intensity emitted by a semiconductor element light source depends on the intensity of the electrical current through it.

Figure 4:
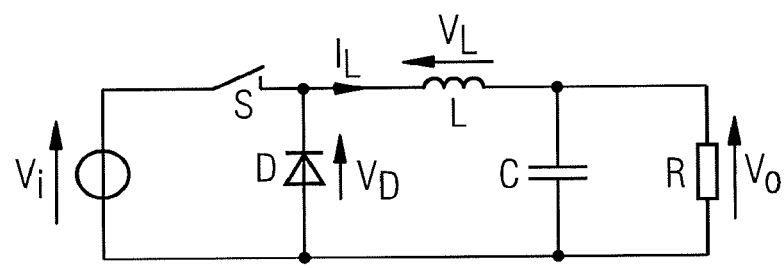
FIG. 4 is an illustration of a prior art electronic circuit for a Buck converter.

FIG. 4 shows an electronic circuit used in a known Buck converter. A converter of this kind is an element for regulating the electrical current supplying electrical power to the light source. The operation of a Buck converter may be divided into two configurations according to the state of the switch S:

In the on state, the switch S is closed, the voltage at the terminals of the inductance has the value $V_L=V_i-V_o$. The current through the inductance increases in a linear manner. The voltage at the terminals of the diode being negative, no current flows through it.

In the off state, the switch is open. The diode conducts in order to ensure the continuity of the current in the inductance. The voltage at the terminals of the inductance has the value $V_L=-V_o$. The current through the inductance decreases.

The switch of the converter is generally implemented by an insulated gate metal oxide semiconductor field effect transistor (MOSFET). Transistors of this kind emit electromagnetic radiation depending on their switching or chopping frequency.

The Buck converter is adapted to supply an electrical current with different average values depending on the chopping frequency chosen and unchanged input and output voltages. It is notably possible to program the ripple current and the peak current of a converter of this kind using a microcontroller. By maintaining the input voltage, the output voltage and the peak current unchanged but changing the amplitude of the ripple current it becomes possible to act directly and rapidly on the average output current of the converter. As the luminous intensity of the semiconductor light source when supplied with power depends directly on the output current, that emitted luminous intensity therefore becomes modulatable by alternating the amplitude of the ripple current of the converter in accordance with a predetermined modulation signal.

Figure 5:
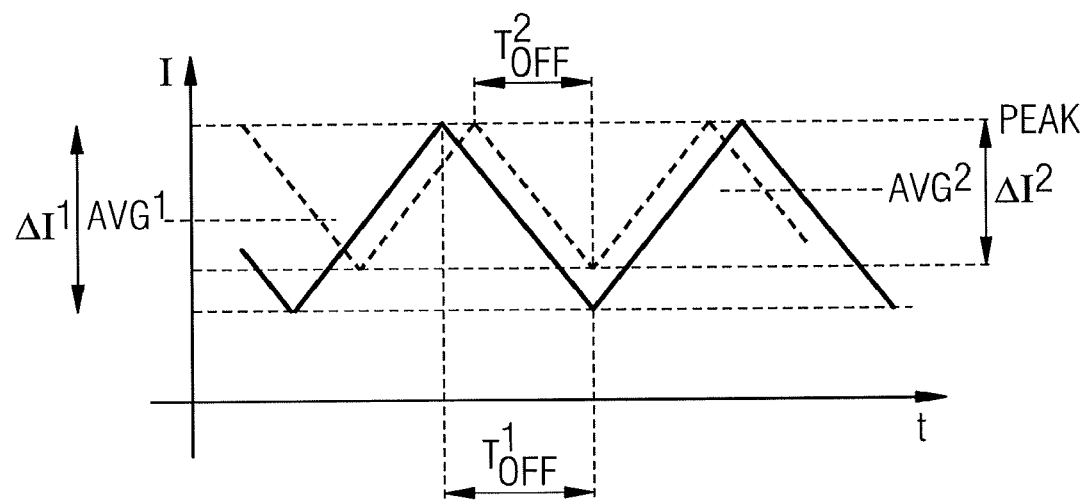
FIG. 5 shows the evolution of the output electrical current of a Buck converter plotted on the time axis as a function of the average output electrical current.

FIG. 5 illustrates this operating principle. In a first phase, corresponding to a first level of modulation, the ripple current has an amplitude $\Delta I^1$. The average output current of the converter has the value $AVG^1$, which is equivalent to the peak current (maximum value reached) less half the value $\Delta I^1$. In this phase the switch of the Buck converter is open during the period $T^1_{OFF}$.

In a second phase, corresponding to a second level of modulation, the ripple current has an amplitude $\Delta I^2$. At equal peak value, the average output current of the converter has the value $AVG^2$. In this phase the Buck switch is open during the period $T^2_{OFF}$. In the example shown this period is shorter than the period $T^1_{OFF}$. The chopping frequency of the Buck converter is therefore different according to the average output current of the converter.

It follows that, by modulating the luminous intensity of the light source in the manner that has just been described, the electromagnetic emission spectrum of the Buck converter may be spread over a range of frequencies that corresponds to the chopping frequencies associated with the various levels of modulation.

If the converter operates using a continuous chopping frequency, the electromagnetic emission spectrum shows a peak around the chopping frequency. By alternating a plurality of chopping frequencies in time, which is the case if the luminous intensity of the light source is modulated, the position of this emission peak in the spectrum follows the same alternation, so that the electromagnetic emissions may be reduced on average over time.

With the aid of the description that has just been given, the person skilled in the art will know how to produce other embodiments producing the effect that has just been described without departing from the context of the invention, which is defined by the scope of the appended claims.

The invention claimed is:
1. Lighting module for a motor vehicle, comprising:
a light source adapted to emit coherent light,
modulation means adapted to modulate the intensity of the light emitted by said source in accordance with a modulation signal, conversion means such that at least a portion of the incident coherent light coming from said source is converted into incoherent light, wherein the module further includes production means of a variation signal indicating the variation of the luminous intensity of incident light disposed downstream of the conversion means, and control means of the light source configured to compare the variation signal to the modulation signal and to control the operation of said light source following the comparison of said variation signal to said modulation signal.

2. Lighting module according to claim 1, wherein the modulation means include regulating means of the electrical current supplying power to the light source.

3. Lighting module according to claim 2, wherein the regulating means of the electrical current include a Buck converter.

4. The lighting module of claim 1, wherein the modulation means uses said modulation signal to confer a measurable property on the coherent light emitted by the light source such that the coherent light is distinguishable from diffused light within the module and distinguishable from external ambient light.

5. The lighting module of claim 4, wherein said measurable property corresponds to a frequency or amplitude of said modulation signal.

6. The lighting module of claim 4, wherein said control means determines whether the variation signal has said measurable property of the incoherent light, and controls operation of the light source based on a result of the determination.

7. The lighting module of claim 6, wherein the control means generates a fault control signal only when the variation signal has said measurable property.

8. Lighting module for a motor vehicle, comprising:

a light source adapted to emit coherent light, modulation means adapted to modulate the intensity of the light emitted by said source in accordance with a modulation signal, conversion means such that at least a portion of the incident coherent light coming from said source is converted into incoherent light, wherein the module further includes production means of a variation signal indicating the variation of the luminous intensity of incident light disposed downstream of the conversion means, and control means of the light source configured to compare the variation signal to the modulation signal and to control the operation of said light source following the comparison of said variation signal to said modulation signal, the modulation means include regulating means of the electrical current supplying power to the light source;

the regulating means of the electrical current include a Buck converter, and wherein the Buck converter is adapted to supply an electrical current with different average values according to the chopping frequency chosen and with unchanged input and output voltages.

9. Lighting module according to claim 8, wherein the modulation means include a modulation signal generator.

10. Lighting module according to claim 9, wherein the conversion means include a photoluminescent material.

11. Lighting module according to claim 10, wherein the production means of the variation signal include an optical sensor sensitive to the wavelength of coherent light emitted by the light source.

12. Lighting module according to claim 11, wherein the optical sensor is sensitive to the wavelength of incoherent light diffused by the conversion means.

13. Lighting module according to claim 11, wherein the production means of the variation signal include a microcontroller functionally connected to the optical sensor.

14. Lighting module according to claim 8, wherein the light source is of the semiconductor laser type.

15. Lighting module according to claim 8, wherein the module includes an optical element positioned so that at least a portion of the incoherent light diffused by the conversion means is deflected in at least one predetermined direction.

16. Lighting module according to claim 15, wherein the optical element includes a reflector element and an optical sensor of the production means of the variation signal is accommodated in a reflective surface of the reflector element.

17. Method of controlling at least one light source of a lighting module according to claim 1, the light source being adapted to emit coherent light in an emission direction, wherein the method includes the following steps:

modulating the intensity of the light emitted by said source using a modulation signal, producing a variation signal indicating the variation of the luminous intensity of the light incident on a production means of a variation signal of the lighting module, comparing at least one characteristic of the variation signal and the modulation signal, and extinguishing said light source if the compared characteristic or characteristics are similar.

18. Method according to claim 17, wherein the compared characteristics include the frequency or the amplitude of the signals.

19. Method according to claim 18, wherein the extinguishing step takes place if the compared characteristics differ from one another by less than 20%.

* * * * *